United States Patent [19]

Tanabe et al.

[11] 4,344,219
[45] Aug. 17, 1982

[54] APPARATUS FOR ARRANGING PARTS

[75] Inventors: Tetsuo Tanabe, Nagaokakyo; Kazumi Takamori, Takatsuki; Akira Matueda, Ibaraki; Kiyoshi Matsui, Ibaraki; Junichi Omura, Ibaraki; Hitoshi Miyamoto, Ibaraki, all of Japan

[73] Assignee: Matsushita Electric Industrial Co., Ltd., Osaka, Japan

[21] Appl. No.: 106,843

[22] Filed: Dec. 26, 1979

[30] Foreign Application Priority Data

Aug. 3, 1978 [JP] Japan ................................ 53-95335

[51] Int. Cl.$^3$ .............................................. B21F 45/00
[52] U.S. Cl. .................................. 29/564.6; 29/33 M; 140/105
[58] Field of Search .................... 29/33 K, 33 M, 35.5, 29/747, 321, 564.1, 564.3, 564.6; 140/105

[56] References Cited

U.S. PATENT DOCUMENTS

| | | | |
|---|---|---|---|
| 3,706,122 | 12/1972 | LaValle | 29/564.6 |
| 3,727,287 | 4/1973 | Davis | 29/564.6 |
| 4,077,439 | 3/1978 | Hamuro et al. | 140/105 |
| 4,166,312 | 9/1979 | Harigane et al. | 140/105 |

Primary Examiner—W. D. Bray
Attorney, Agent, or Firm—Stevens, Davis, Miller & Mosher

[57] ABSTRACT

An apparatus for arranging a plurality of different electric parts in a predetermined order for insertion into the substrate of a printed circuit board is disclosed. The apparatus has a plurality of cutter mechanisms arranged to receive respective tapes carrying respective electric parts. The cutter mechanism cuts the tape successively upon receipt of a control signal to sever the electrical parts one by one successively. The apparatus also has a plurality of carrier mechanisms arrayed on the periphery of a turn table which is arranged to be driven intermittently. When a carrier mechanism is positioned in front of the cutter mechanism having the desired electric part, the cutter mechanism is activated to sever the electric part and transfer the same to the carrier mechanism. Thus, the carrier mechanisms on the periphery of the turn table are loaded with respective electric parts. In this state, the electric parts are arrayed in the circumferential direction in a predetermined order for insertion to the substrate of a printed circuit board. Finally, the electric parts carried by the successive carrier mechanisms are attached in that order to adhesive tapes to form secondary taped parts which are to be delivered to an automatic electric part insertion device.

5 Claims, 31 Drawing Figures

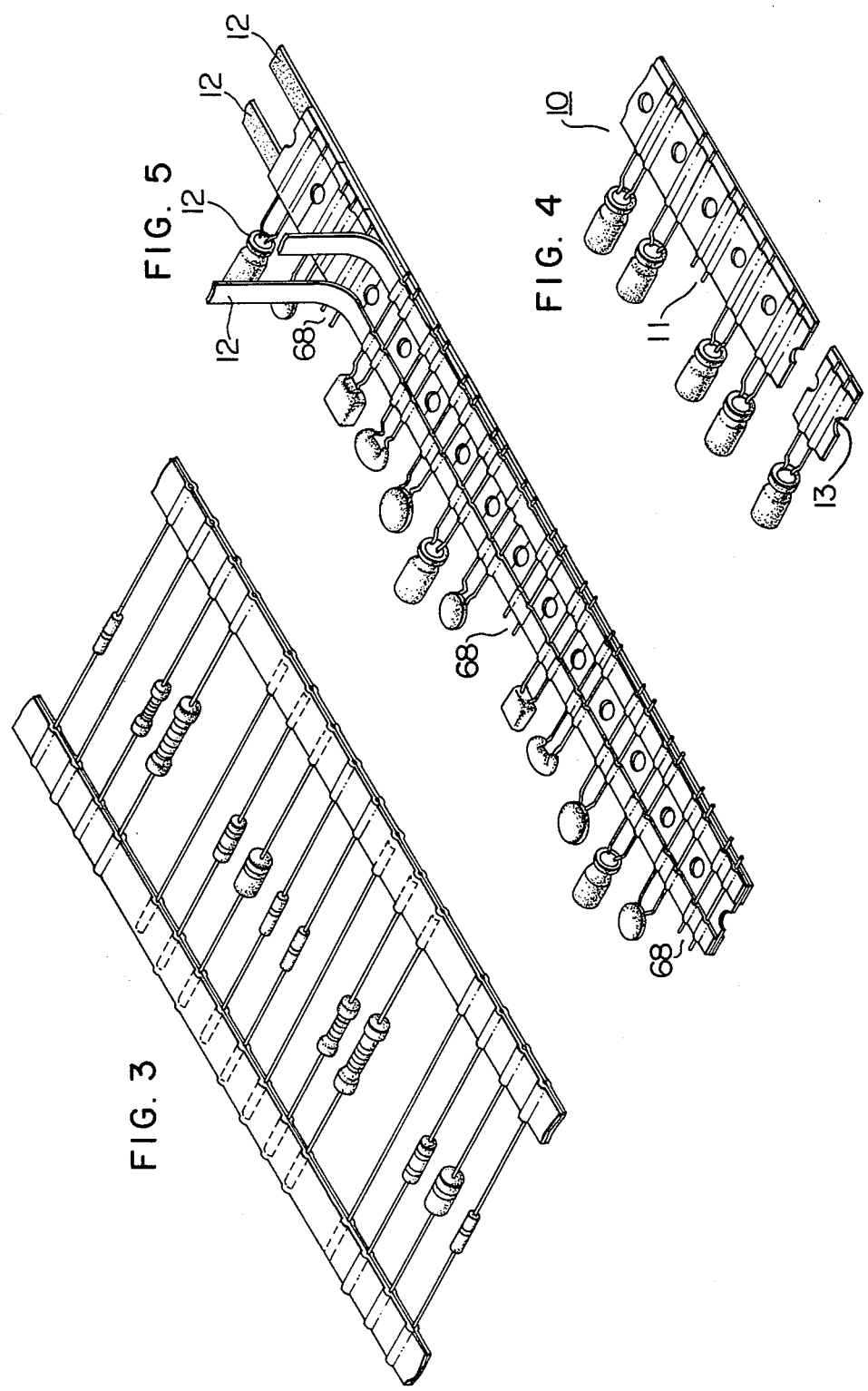

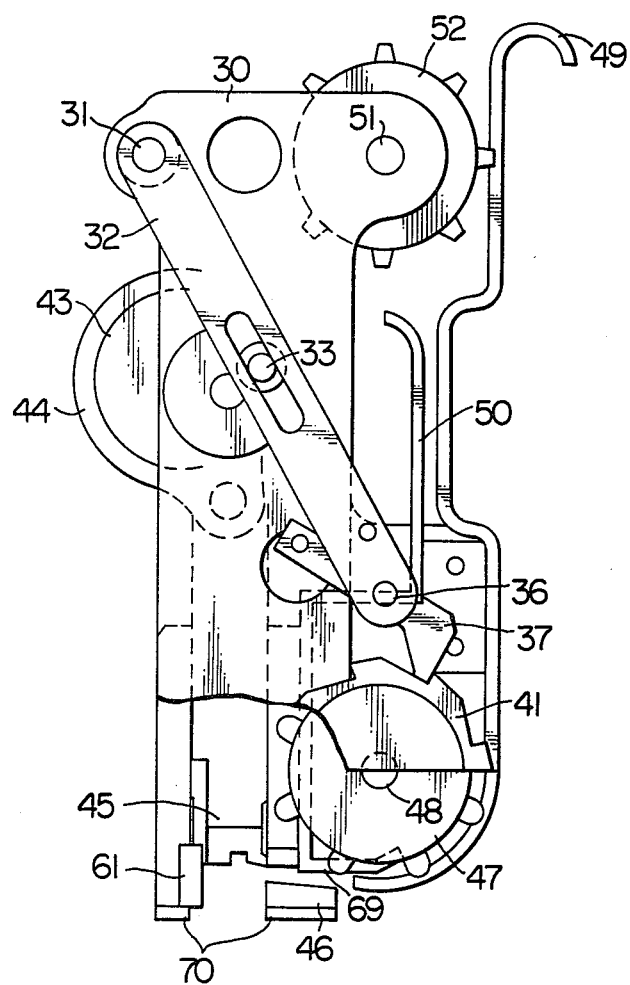

APPARATUS FOR ARRANGING PARTS

BACKGROUND OF THE INVENTION

The present invention relates to an apparatus for arranging electric parts in a predetermined order, and particularly to an apparatus for arranging various radial type electric parts having at least two leads projected outwardly in the same direction from its body and carried on a carrier tape. The electric parts are re-arranged on another carrier tape which feeds the electric parts thereon in the predetermined order to an automatic electric part insertion device.

In producing printed circuit boards having electric parts inserted therein, automatic part insertion devices for inserting the electric parts into a predetermined portion of a substrate have been developed and put into practical use for inserting both axial type electric parts and radial type electric parts.

Broadly speaking, the insertion devices which are used now are of two types. One type is devised to pickup the electric parts from different magazines or tapes and to insert them into the substrates, while the other type is devised to be supplied with electric parts which have been previously sequentially arranged on a tape in the order of insertion or to be fed from a single storage source.

For the latter type insertion device, however, no effective apparatus for sequentially arranging radial type electric parts has been developed.

SUMMARY OF THE INVENTION

It is, therefore, a major object of the invention to provide an apparatus capable of arranging on a tape radial electric parts in a predetermined order of insertion into a circuit board substrate.

To this end, according to the invention, there is provided an apparatus for arranging electric parts comprising: a plurality of cutters for cutting associated tapes carrying respective electric parts adhered thereto at a constant pitch so that each tape is separated between adjacent electric parts, thereby to separate the electric parts into independent electric parts having pieces of the tape; a plurality of carriers which are arrayed in order and moved successively; means for actuating the carriers to grasp the respective electric parts; and means for transferring from the carrier and adhering the electric parts to another tape at a constant pitch in the predetermined order.

The above and other objects, as well as advantageous features of the invention will become clearer from the following description of the preferred embodiment of the invention taken in conjunction with the accompanying drawings.

BRIEF DESCRIPTION OF THE DRAWINGS

FIG. 3 is a perspective view of axial electric parts arranged on tapes in accordance with a conventional technique;

FIG. 4 is a perspective view of radial electric parts arranged on tapes in accordance with the present invention;

FIG. 5 is a perspective view of radial electric parts after rearrangement in accordance with the invention;

FIGS. 15a and 15b are plan view of the cutter shown in FIG. 13 and a front elevational view of an essential part of the cutter shown in FIG. 13, respectively;

DESCRIPTION OF THE PREFERRED EMBODIMENTS

Figure 1:
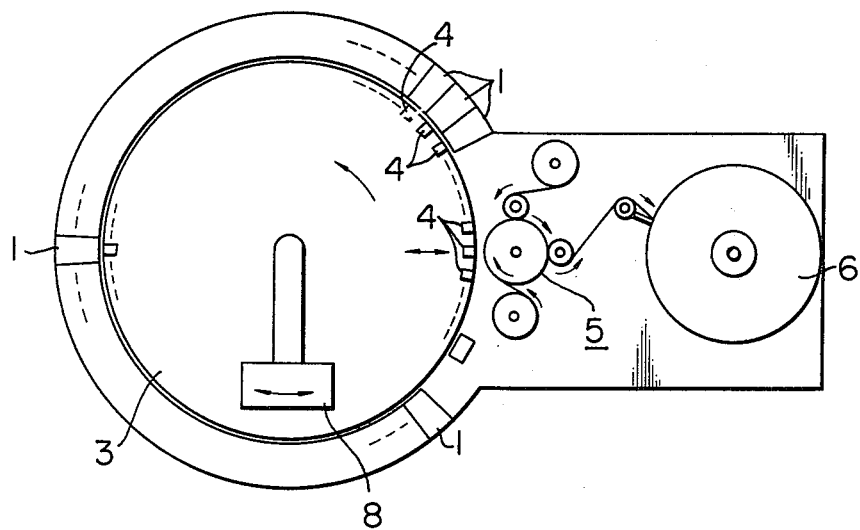
FIG. 1 is a plan view of the apparatus for arranging electric parts, constructed in accordance with a first embodiment of the invention.

Before turning to the description of the preferred embodiments, a description will be made hereinafter as to the outline of the present invention, with specific reference to FIGS. 1 and 2.

A disc-shaped turn table 3 is supported for rotation in only one direction. A taping mechanism generally designated at a reference numeral 5 is disposed to face a peripheral portion of the turn table 3. A plurality of cutters 1 are arranged around portions surrounding the periphery of the turn table 3 other than the portion occupied by the taping mechanism 5. The number of the cutters is, for example, 40. Each of the cutters is associated with radial type electric parts such as capacitors, carried by tapes. More specifically, a plurality of electric parts of the same kind are arranged between a pair of elongated adhesive tapes at a constant pitch as shown in FIG. 4. The radial electric parts in this state are referred to as "primary taped radial parts" or "primary taped parts", hereinafter. Each of the cutters carries one kind of primary taped parts. The respective primary taped parts on different kinds of cutters include different electric parts from each other.

Figure 6:
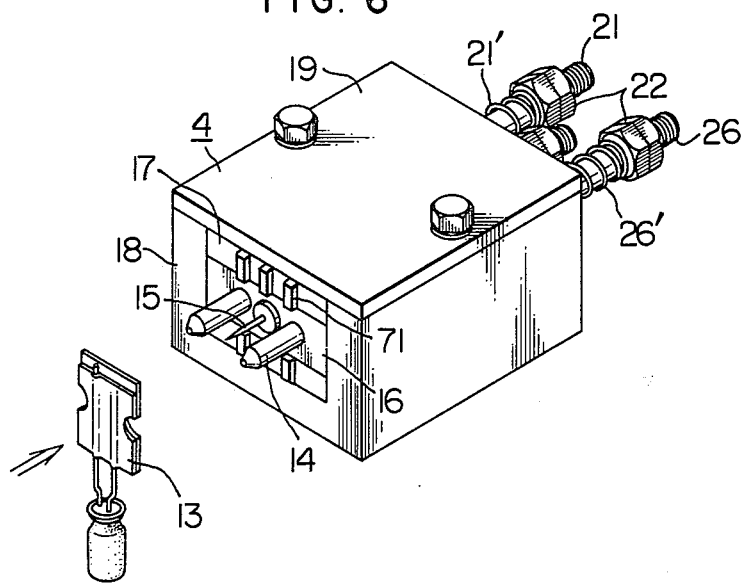
FIG. 6 is a perspective view of a carrier of the apparatus of the invention for arranging electric parts.

A plurality of carriers 4 are disposed on the periphery of the turn table 3 so as to correspond to the cutters 1. In accordance with a control signal delivered by an electronic programming device 9 through a driving control section, one of the cutters 1 is actuated to cut the tapes thereby to separate one part together with tape pieces as denoted by numeral 13 in FIG. 4. The severed part is then pushed toward the carrier 4 as shown in FIG. 6 opposing the cutter, and is grasped by the carrier 4. Thereafter, the turn table 3 is rotated by an angle corresponding to one pitch between two adjacent cutters, in the direction of the arrow. After the stopping of the turn table 3, another cutter is actuated in response to the next control signal to sever a part from another primary section of taped parts together with tape pieces and to deliver the severed part to the corresponding carrier. The rotary table 3 is then rotated again. As this operation is continued, some of the carriers, which have been empty before the commencement of the operation, are loaded with the parts. After one full rotation of the turn table 3, the carriers 4 are loaded with parts, respectively in accordance with desired order. The cutters 1 are not activated sequentially in the circumferential direction, but each cutter is activated when it is opposed by a designated carrier which is bound to carry the particular electric part associated with the cutter, whereby the different kinds of electric parts are carried by the respective carriers in a predetermined order. After one full rotation of the rotary table, the plurality of carriers have been respectively loaded with a plurality of electric parts of different kinds arranged in the desired order.

The taping mechanism 5 has two pairs of adhesive tapes. The electric parts carried by the carriers 4 arriving at the taping mechanism 5 are successively forced out of the carriers and adhered between two pairs of adhesive tapes, thereby to form secondary taped parts in which a plurality of different electric parts are arranged in the predetermined order. The secondary taped parts are detached from a winder reel and are delivered to an automatic part insertion device so as to be automatically inserted into a printed circuit board successively one by one.

A preferred embodiment of the invention will be described in detail hereinafter with reference to the drawings.

Figure 2:
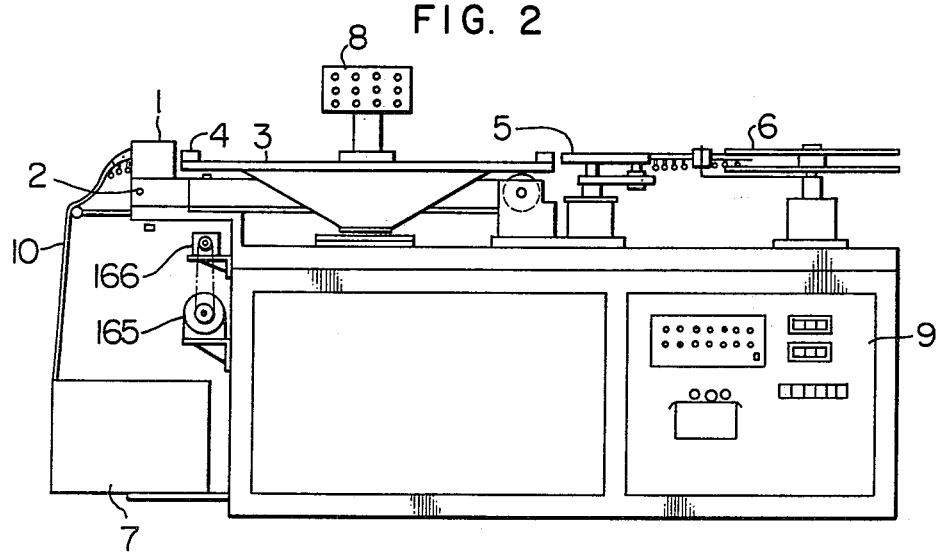
FIG. 2 is a side elevational view of the apparatus shown in FIG. 1.

Referring to FIGS. 1 and 2 which are a plan view and a side elevational view of an apparatus for orderly arranging radial type electric parts, a plurality of tape cutter mechanisms 1 for cutting the tapes of radial type electric parts are circularly arranged around a turn table 3, together with cutter actuating mechanisms 2. A plurality of carriers 4 for carrying electric parts are mounted on the turn table 3. A taping mechanism 5 disposed on one side of the turn table 3 fastens between tapes a plurality of electric parts in a predetrmined order. A mechanism for winding up the tapes carrying the electric parts is designated as reference numeral 6.

Reference numeral 7 denotes a storage for the primary taped parts. A control panel for usual operation of the apparatus is designated at reference numeral 8. Reference numeral 9 generally designates an electric programming device for controlling the group of the cutters 1 and the tape winding device 6, and a driving control section.

The primary radial taped parts are rearranged by the apparatus having the above described construction into secondary taped parts shown in FIG. 5 as the apparatus operates in a manner described hereinunder.

The primary radial taped parts are stored around the apparatus, as denoted by reference numeral 7. The primary taped parts are then introduced to the corresponding tape cutter mechanism 1 through a tape guide.

Figure 16A:
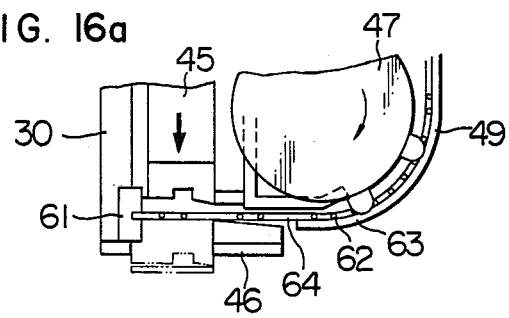
FIG. 16a is a plan view of an essential part of the cutter shown in FIG. 13, associated with a primary tape.
Figure 16B:
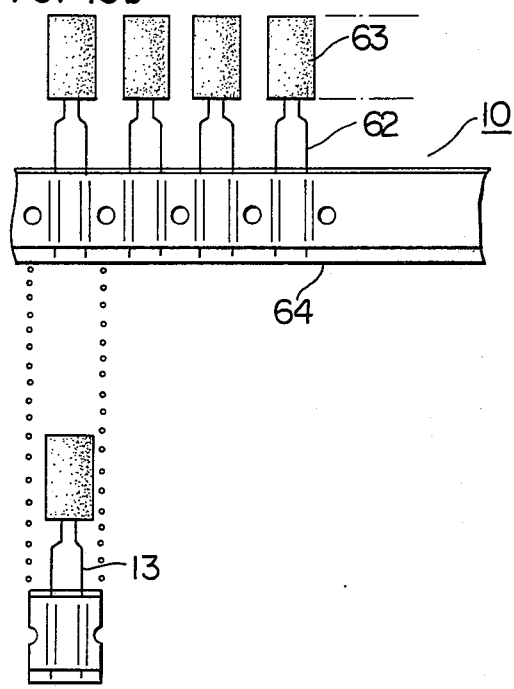
FIG. 16b is a front elevational view of a primary tape.

The operation of the tape cutter mechanism 1 will be described hereinunder with reference to FIGS. 13 to 16b. More specifically, FIG. 13 is a perspective view of the whole part of the cutter mechanism 1, FIG. 14a is a sectional side elevational view of the same mechanism, FIG. 14b is a bottom plan view of an essential part of the cutter mechanism as viewed in the direction of an arrow A, FIG. 15a is a plan view of the cutter mechanism, FIG. 15b is a front elevational view of an essential part of the cutter mechanism, FIG. 16a is a plan view of an essential part of the cutter mechanism, and FIG. 16b is an illustration of a primary taped part cut by the cutting mechanism.

The primary taped parts 10 in which a plurality of electric parts 63 are adhered at their leads 62 to a pair of tapes 64 are introduced to a guide sprocket 52 which is rotatably mounted on the cutter structure 30 by means of a shaft 51. Further, the primary taped parts 10 are delivered through guide plates 49, 50, to a primary tape feed sprocket 47. The feed sprocket 47 feeds the primary taped parts 10 to the end 61 of the cutter through a gap between a stationary blade 46 and a guide plate 69, as will be seen from FIG. 15a.

Figure 13:
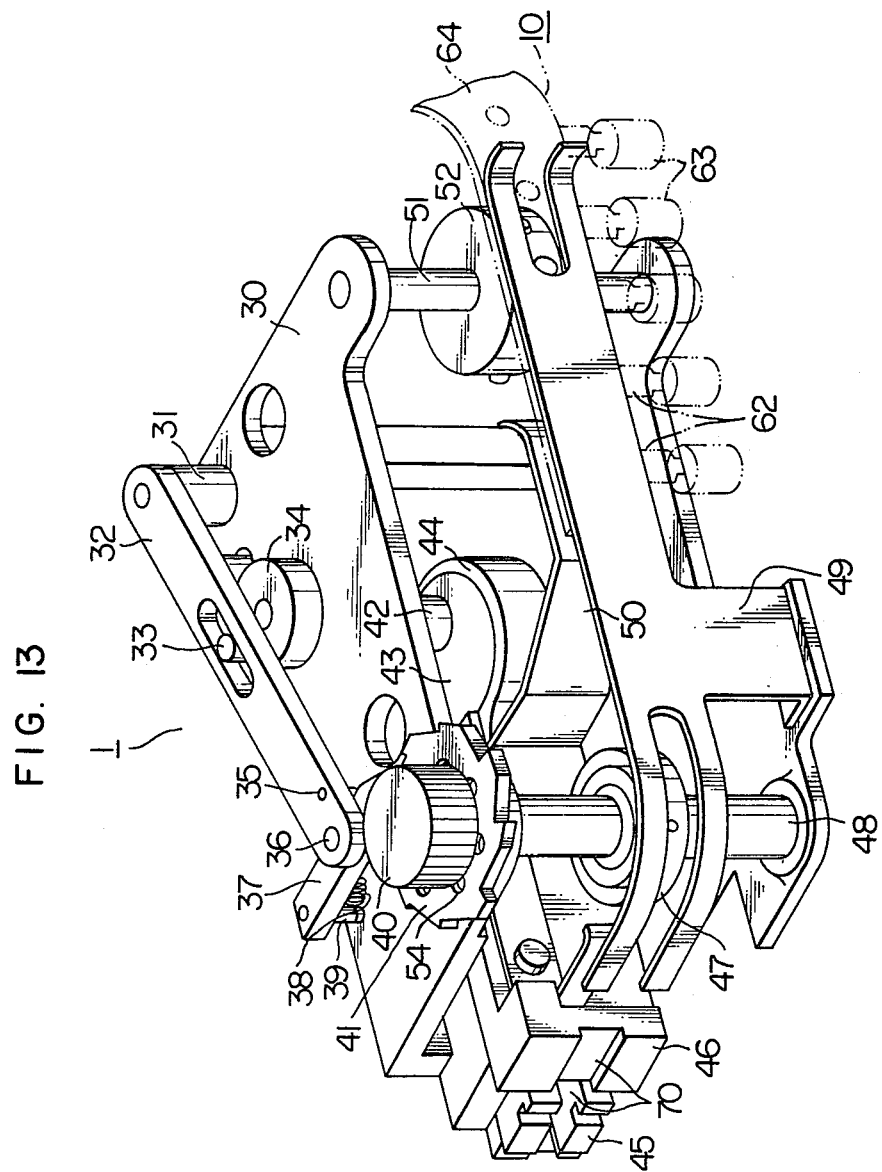
FIG. 13 is a perspective view of a cutter incorporated in the apparatus.
Figure 14A:
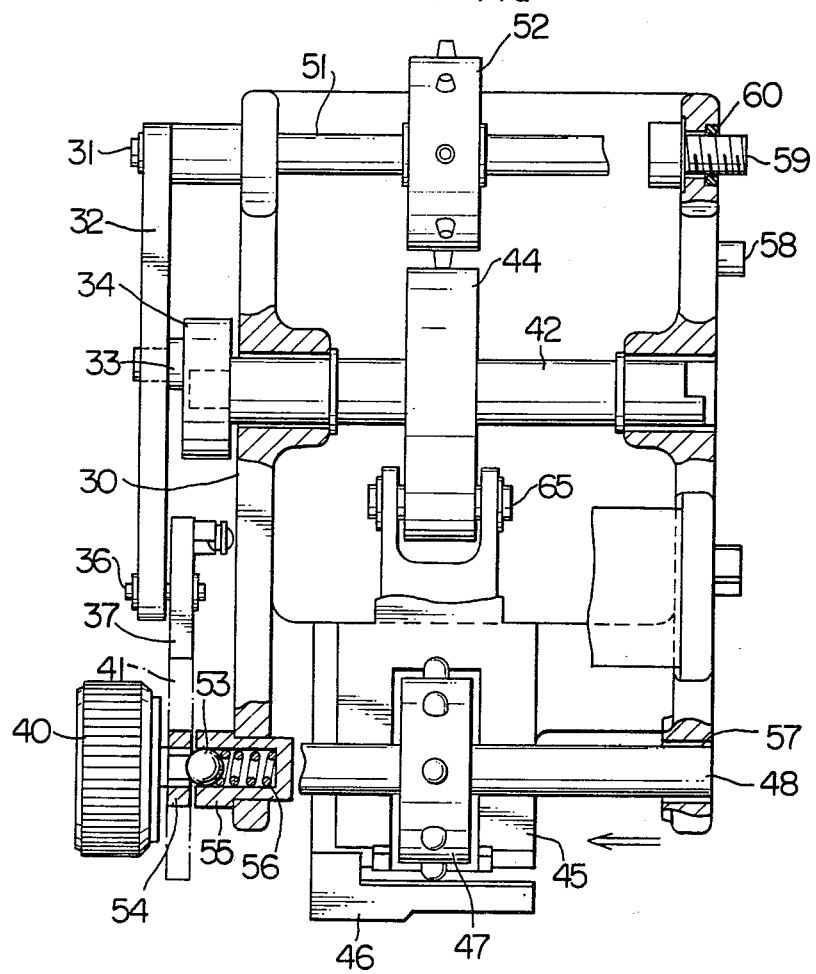
FIGS. 14a and 14b are sectional side elevational view and bottom plan view of an essential part of the cutter shown in FIG. 13.
Figure 14B:
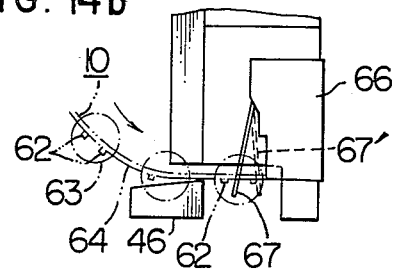

The power for cutting the tape is transmitted through a shaft 42 as shown in FIGS. 13 and 14. The power for rotatively driving the shaft 42 is derived from a cutter actuating mechanism 2 disposed under the cutter mechanism 1, usually for each rotation of the shaft 42. The torque of the shaft 42 is transmitted to a crank cam 43 fixed to the shaft 42. The rotation of the crank cam 43 causes a cranking action of a crank ring 44 fitted around the cam 43, so that a movable cutter blade 45, which is operatively connected to the crank ring 44 through a connecting pin 65 as shown in FIG. 14a, makes one cycle of reciprocating motion for each rotation of the shaft 42. The movable blade 45 is slidably received by a sliding groove formed in the body of a stationary blade 46. During the reciprocating operation of the movable cutter blade 45, the tapes 64 of the primary taped parts are cut by a cooperation of the movable cutter blade 45 and the stationary cutter blade 46. As will be seen from FIG. 16b, the tapes 64 are cut at the mid portion of each sprocket port to separate the primary taped parts 63 into independent parts 63 carried by tape pieces. As a result, a semicircular recess is formed at each end of each tapepiece.

During the reciprocating movement of the movable cutter blade 45, a crank 34 provided at one end of the shaft 42 causes rocking motion of a lever 32 around the axis of a fulcrum shaft 31, due to a cooperation of a crank pin 33 and an elongated sliding groove of a lever 32. As a result, the ratchet pawl 37 secured to the lever end by a pin 36 kicks a ratchet gear 41 to rotate a shaft 48 which is journalled by a hole 57. At the same time, the tape feed sprocket 47 fixed to this shaft 48 is rotated to feed the primary taped parts 10 by one pitch.

A knob 40 attached to the end of the shaft 48 can be rotated manually in the feeding direction to facilitate the setting of the primary taped parts 10. A spring 38 for biasing the ratchet pawl 37 is stretched between a pin 39 and another pin 35 provided on the lever 32.

The ratchet gear 41 includes a recess 54, a plunger 55 fixed to the structure 30, a steel ball 53 incorporated in the plunger 55 and a spring 56 for biasing the steel ball 53 into the recess 54, and is so constructed as not to be rotated when the ratchet pawl 37 is moved backward.

Figure 20:
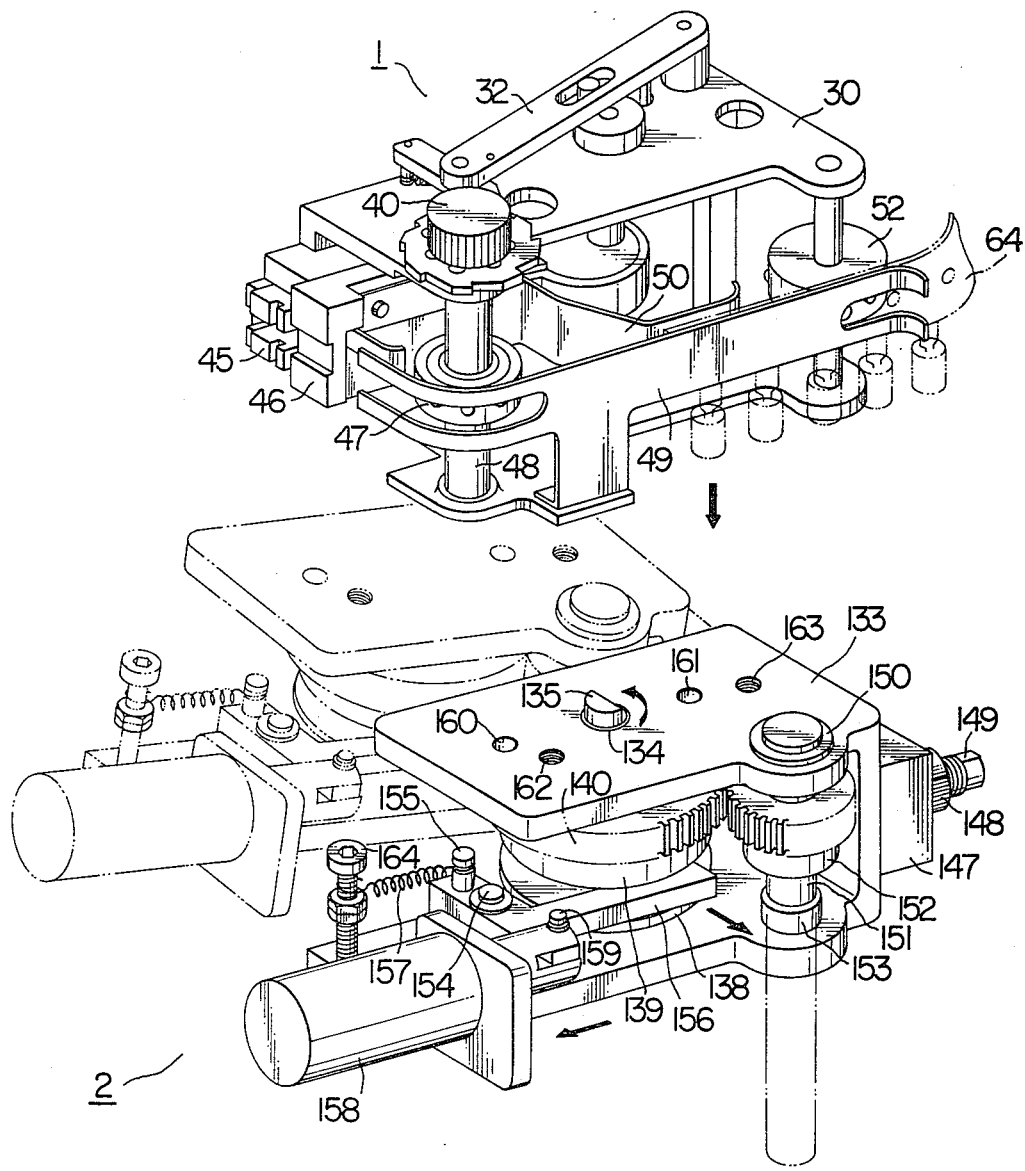
FIG. 20 is a perspective view of the cutter and the cutter driving mechanism incorporated in the apparatus.
Figure 21A:
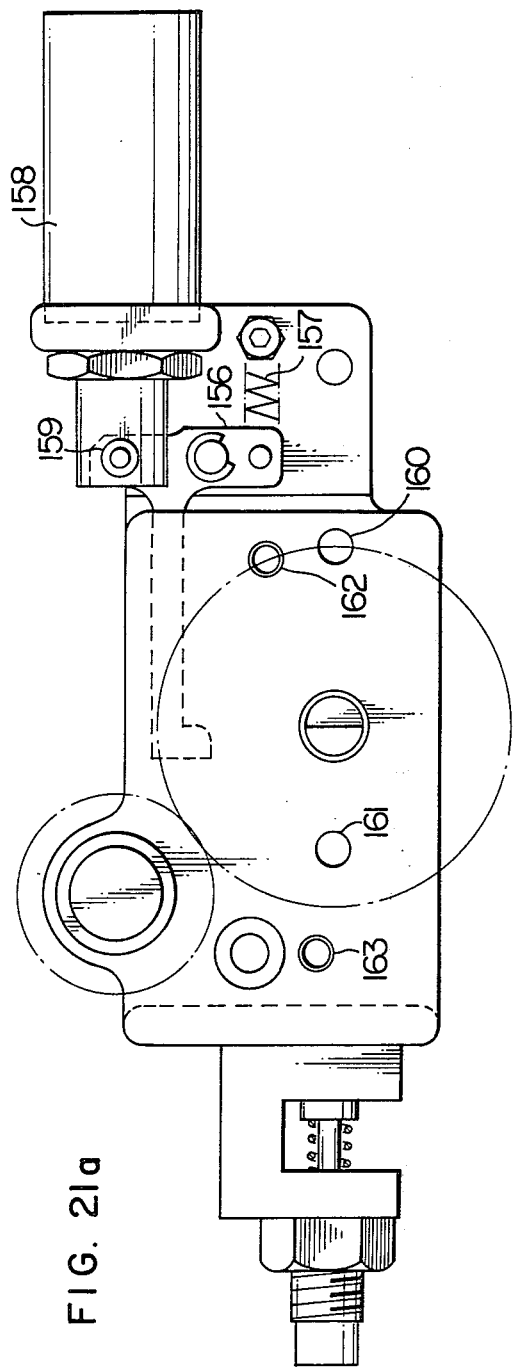
FIGS. 21a, 21b and 21c are, respectively, a plan view, sectional side elevational view and a sectional back elevational view of the cutter driving mechanism.
Figure 21B:
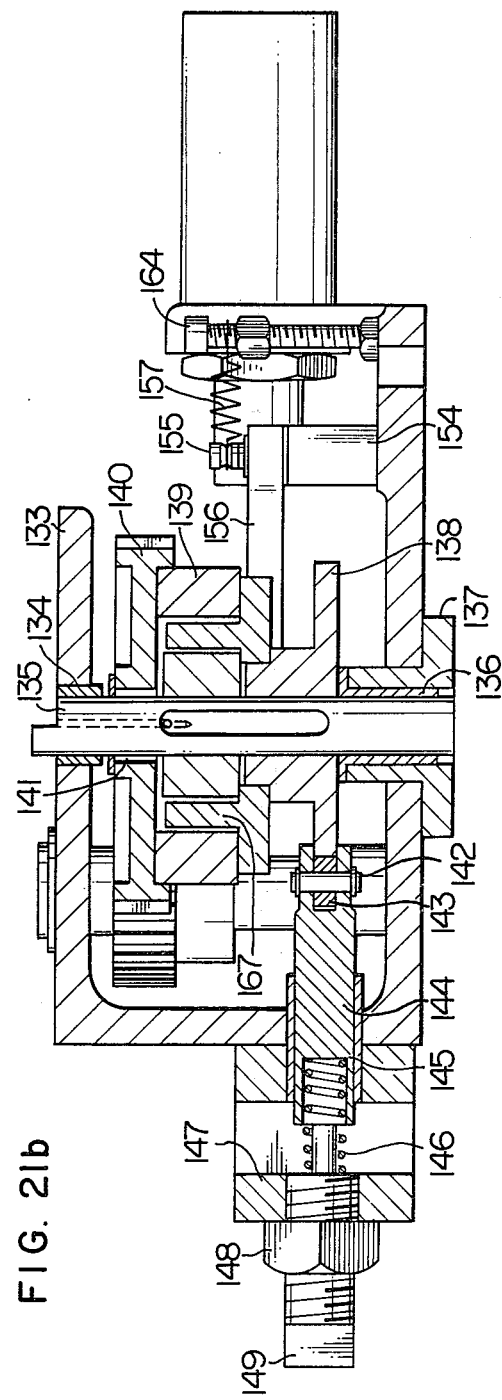
Figure 21C:
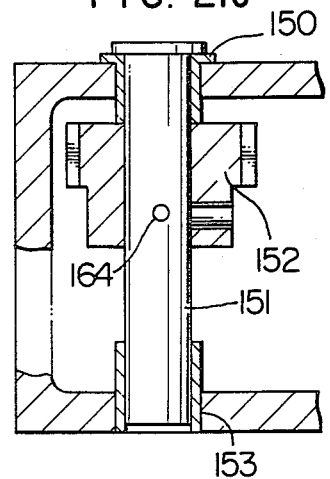

The cutter actuating mechanism 2 shown in FIGS. 21A, 21B, 21C is arranged in a manner shown in FIG. 20 beneath the cutter mechanism 1.

In order to obtain a correct and easy attaching and detaching of the cutter mechanism 1 to and from the driving mechanism 2, a pair of locating pins 58 as shown in FIG. 14a are embedded in the cutter frame 30 which is fastened to the actuating mechanism by means of a pair of screws 59. In order to prevent the dropping of the screws 59 and to facilitate the fastening by these screws, anchoring rubber rings 60 are provided.

Usually, the primary taped parts are inspected before the delivery by the manufacturer and have vacant spaces as denoted by 11 in FIG. 4 and from which unacceptable parts have been removed. In some cases, the tapes 64 lack three successive electric parts. It is, therefore, one of the most important points in designing the cutter mechanism 1 to avoid the influence of the absence of the electric parts.

According to the invention, therefore, a detecting element 66 such as a microswitch having a detecting tabe 67 is disposed at the terminal end of the cutter mechanism as shown in FIG. 14b such that the detecting tab 67 is contacted by the leads 62 of the electric part adhered to the tape. The detecting element 66 is adapted to deliver a signal to the control circuit upon detecting the lack of the part. The control circuit then acts to cut the tapes and further feed the tapes. The cut and feed of the tapes are repeated until an electric part is detected. As the electric part comes to the position of the detecting element 66, it contacts and presses the detecting tab 67 to move the latter to the position 67" shown by broken lines.

In order to precisely feed the tapes to the cutter blades, the stationary cutter blade is provided with a tape locating section 61 as shown in FIG. 15a. The cutting edge of the movable cutter blade 45 is provided with a shear angle $\theta$ from the center thereof as shown by two-dot-and-dash lines in FIG. 10b to minimize the cutting power.

In addition to the cutter mechanisms corresponding to the number of kinds of the electric parts constituting the secondary taped parts, an additional cutting mechanism is provided so as to create a vacant pitch position 68 as shown in FIG. 5 for the insertion device to identify one complete sequence of the secondary taped parts.

In the apparatus for arranging the axial type electric parts, as shown in FIG. 3, the vacant pitch position for this purpose is attained by skipping a part on the secondary tape, since the cutting and taping of parts are made at the leads. Therefore, the vacant pitch position for the identification is effected by making a skipping as if there were no part. However, this technique cannot be used in the apparatus for the radial electric parts, because in this type of apparatus the cutting is made at the tapes and the secondary tape is required to have perforations for engaging the teeth of the tape feeding sprocket of the insertion device. In order to obtain this vacant pitch position 68, for the radial electric parts, the present invention makes use of a wste tape having no electric parts.

More specifically, in order to obtain the vacant pitch portion for secondary tape parts of the axial tape, the axial parts are fed to the automatic electric part insertion device through the feeding mechanism, which includes a rachet wheel which hooks the successive leads of the axial type electrical parts with its rachet teeth. Pitch distance can be held relatively constant since the rachet teeth exert their driving force at the leads of the electric parts, which have a relatively high strength. However, in the arranging apparatus with radial type electric parts, as shown in FIG. 5, the pitch distance defined by the perforations tends to be altered by deformation of the perforations as the perforations are engaged by the teeth of a sprocket wheel in the feeding mechanism. In order to avoid the primary tapes from being elongated due to this deformation, a relatively thick pasteboard is used as one of the primary tapes, which increases the thickness of the primary tapes. Such a thick tape can cause problems with tape winding and twisting. Therefore, the feeding mechanism for the tape parts of the radial type is provided with an additional sprocket wheel, which lends support to the thick tape while it hooks the successive perforations of the tape with its rachet teeth. Since the additional sprocket wheel engages only one perforation at one time with one of its rachet teeth, positive feeding of the tape cannot be assured if any of the perforations is missing. To solve this problem, waste tape pieces of the primary tape, having no electric part, are used in the present invention in order to obtain the vacant pitch portion 68 shown in FIG. 5. The applicant has found that, if the vacant pitch portion is made by simply feeding the tape, a weak and excessively flexible portion is produced in the secondary tape parts between two pieces of the pasteboard, which causes the secondary taped parts to be yielded or folded between two pieces of the pasteboard during the feeding of the secondary taped parts by the sprockets. Such folded sections of the secondary taped parts jam the feeding of the secondary tape parts.

Figure 7:
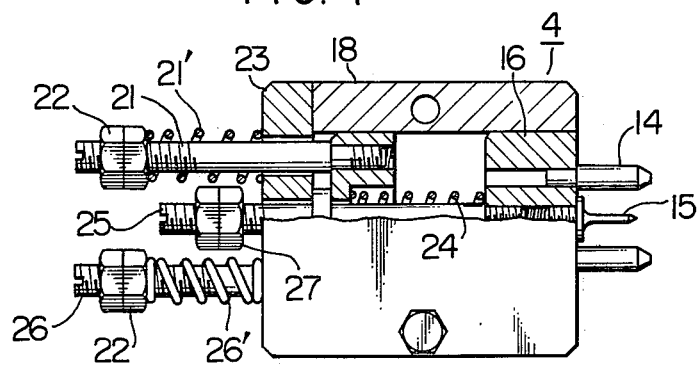
FIG. 7 is a sectional plan view of the carrier shown in FIG. 6.
Figure 8:
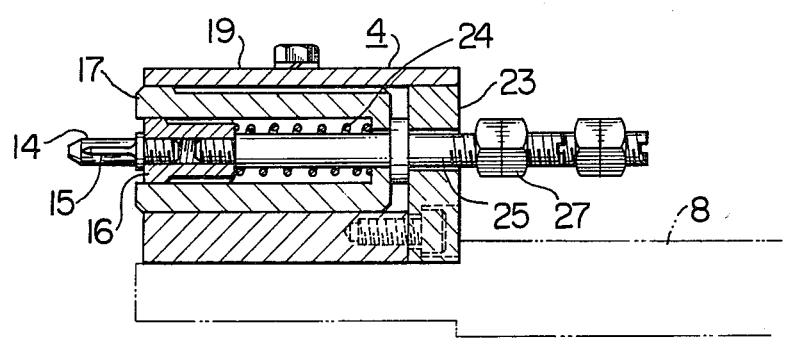
FIG. 8 is a sectional side elevational view of the carrier shown in FIG. 6.
Figure 9:
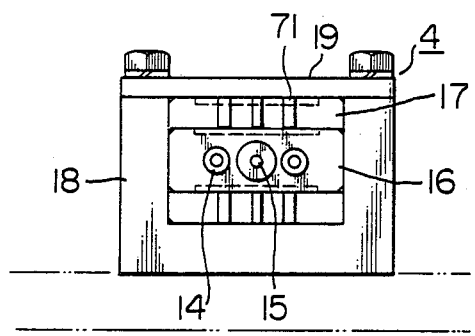
FIG. 9 is a front elevational view of the apparatus.
Figure 10A:
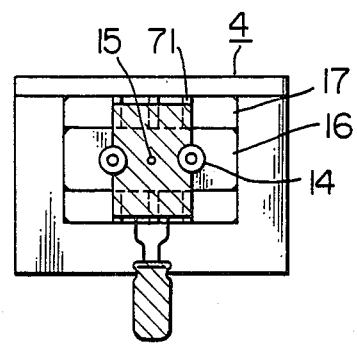
FIGS. 10a and 10b are a front elevational view and a side elevational view of the carrier.
Figure 10B:
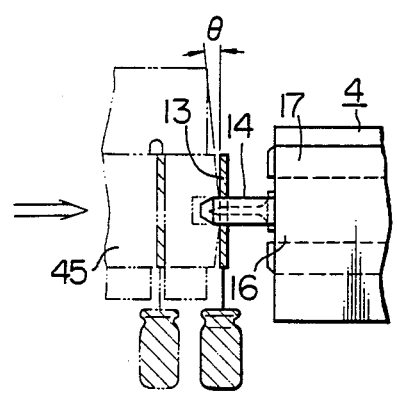
Figure 10C:
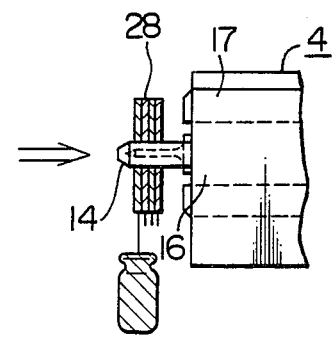
FIG. 10c is a side elevational view of the carrier.
Figure 11:
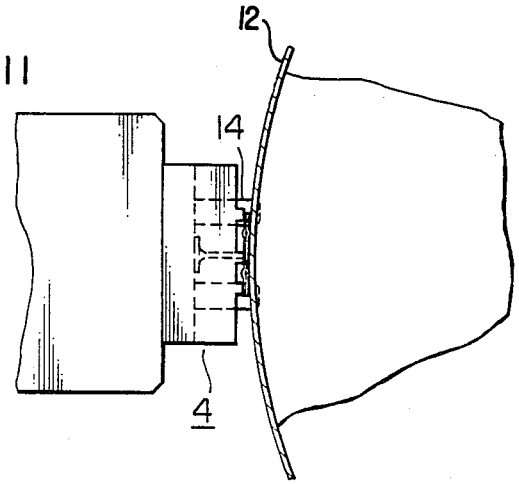
FIG. 11 is a plan view of the carrier.

Hereinafter, a description will be made as to the construction of the carrier mechanism 4 for carrying and transporting the electric parts. FIG. 6 is a perspective view of the carrier mechanism, while FIG. 7 is a sectional plan view of the carrier mechanism, FIGS. 9 and 10a are front elevational views of the carrier mechanism 4, while FIGS. 10b and 10c are partial side elevational views of the same.

Referring to FIG. 6, the severed electric part 13 together with the piece of the tape is pushed by the movable cutter blade 45 of the cutter mechanism in the direction of arrow toward the carrier mechanism 4, and is stabbed by a needle 15 so as to be retained by the latter. Two guide pins 14 play the important role of engaging the semicircular recesses which have been formed at both sides of the tape pieces as a result of the cutting in order to maintain the level of the severed electric part.

The severed electric part which is pushed by the movable cutter blade 45 may slip off after it has cleared the tape locating section 61 of the stationary cutter blade 46. In order to avoid this, the guide pins 14 of the carrier mechanism 4 are so designed as to move into the tape locating section 61 of the stationary cutter blade 46, to receive the severed electric part while the latter is in the tape locating section 61. A groove 70 shown in FIGS. 13 and 15a is provided to permit the movement of the guide pins 14 during the movement of the carrier mechanism 4.

A stopper 17 is slidably mounted in a main body 18 of the carrier mechanism 4. Two parallel shafts 21, 26 are provided behind the stopper 17. These two shafts 21, 26 extend outwardly from a main block 23 through apertures formed in the latter, and are slidable along these apertures. Compression springs 21', 26' are wound around the shafts 21, 26. The spring loads are adjustable by means of adjusting nuts 22 screwed to the shafts 21, 26. Therefore, the stopper 17 can be moved ahead as the shafts 21, 26 are pushed from the rear side. A pin block 16 is slidably mounted in the stopper 17. The aforementioned pins 14 are press-fitted into the pin block 16, and the rear end portion of the aforementioned needle 15 is screwed into the pin block. A shaft 25 extends through a bore formed at the center of the bottom of the stopper 17 and through a coiled spring 24 so as to be screwed into the back surface of the pin block 16 opposite to the pin-attaching surface of the latter. The stroke of sliding movement of the pin block 16 is adjustable by means of nuts screwed into the shaft 25.

A reference numeral 19 denotes an upper lid of the main body.

The carrier mechanism operates in a manner explained hereinunder. As the two shafts 21, 26 are pushed in, the stopper 17 connected to the shafts 21, 26 is pushed forward. In this state, the bottom portion of the stopper 17 slides along the shaft 25 to compress the coiled spring 24 through which the pin block 16 slides by a stroke distance which is determined by the adjustment degree of the nuts 27. A further forward pushing of the shaft 21 causes only the stopper 17 to move ahead. This operation greatly contributes to the stabilization of the attachment of the electric parts 13 to the tapes of the secondary taping part.

Figure 12A:
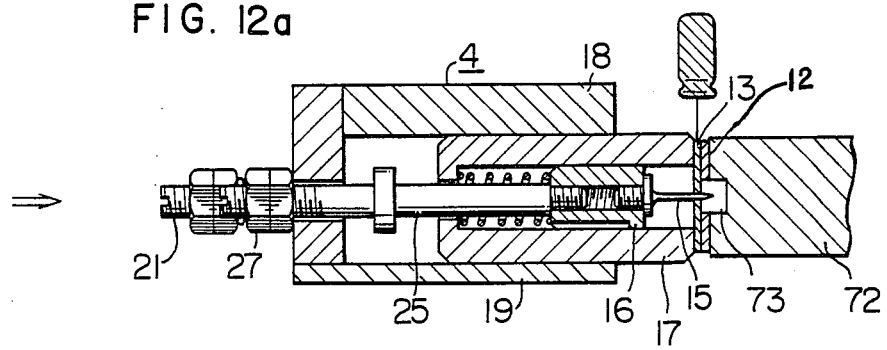
FIGS. 12a, 12b and 12c are a sectional side elevational view, plan view and another sectional side elevational view, respectively, of the carrier.
Figure 12B:
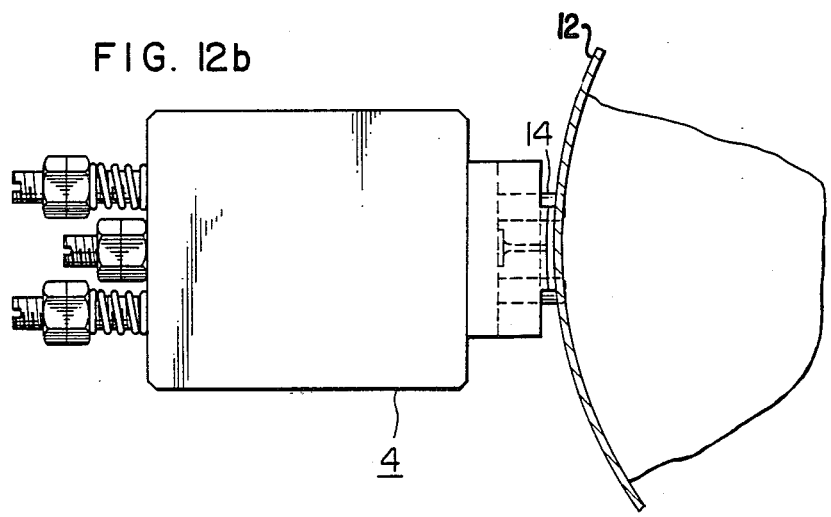
Figure 12C:
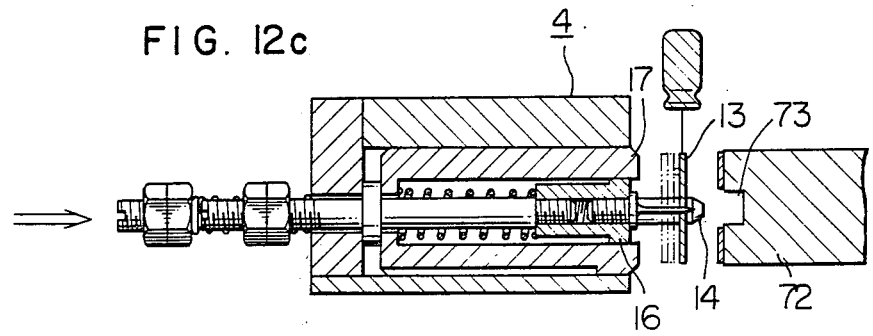

As stated before, the primary taped part includes vacant spaces formed as a result of removal of the unacceptable electric part. When the tapes are cut at portions thereof after the vacant space, the unnecessary tape pieces 28 are held between two guide pins 14 as shown in FIGS. 10c and are conveyed as the carrier mechanism 4 is moved. The carrier mechanism conveys the electric part and the vacant tape pieces to the tape attaching section of the taping mechanism 5, while making intermittent rotations. As the carrier mechanism 4 reaches the tape attaching section of the taping mechanisms 5, the shafts 21, 26 are pushed forward to move the stopper 17 ahead thereby to adhere the electric part to the adhesive tapes 12 which are prepared on the taping drum. As will be seen from FIGS. 12, 12b, 12c, the tapes are prepared on the taping drum with their adhesive surfaces directed to the outside, i.e. opposing the carrier mechanism 4.

An essential point of the operation is to press the severed electric part to the adhesive tape while it is held by the guide pins 14 and the needle 15. To this end, the taping drum 72 is provided with a groove 73 for receiving the pins. As the shaft 21 is pushed forward in this condition, the guide pins 14 and the needle 15 are moved together with the stopper 17 coming into the groove 73 of the taping drum 72. The stroke adjusting nuts 27 for the pin block 16 are so adjusted that the forward movement of the pin block 16 is stopped when the pins reach the bottom of the groove 73. Thereafter, only the stopper 17 moves ahead compressing the coiled spring 24 to move the electric part along the pins to adhere the same to the adhesive tapes 12 prepared on the taping drum 72.

Subsequently, the stopper 17 is moved aback and then the guide pins 14 and the needle 15 are retracted. During the backward movement of these pins, the electric part is not moved aback, because it has been adhered to the tapes 12 already. Some of the carriers carry unnecessary tape pieces as shown in FIG. 10c. However, since the necessary electric part is positioned on the tape attaching side, only the necessary electric parts are transferred to the adhesive tapes 12 on the drum 72, and the unnecessary tape pieces are left on the pins 14, 15.

The unnecessary tape pieces are pushed again by a pusher 74 in the next step of the index table so that all of the unnecessary tapes are allowed to drop freely.

Projections 71 on the stopper 17 ensure complete attachment of the electric part 13 to the adhesive tape.

Usually, the electric parts are held in such a manner that their leads are sandwiched between a stiff carrier tape and a thin soft adhesive tape overlying the stiff tape. The transfer and attachment of the electric part to the adhesive tapes 12 do not cause substantial problems if the arrangement is such that the stiff carrier tape is pressed again to the adhesive tapes 12 supported by the drum 72, because in such a case the stiff carrier tape provides a flat attaching surface. However, when the arrangement is such that the thin soft tape is pressed against the adhesive tapes 12, the soft tape is made to protrude in its parts due to the presence of leads of the electric part to hinder the complete adhesion to the adhesive tapes 12. To avoid this, the projections 71 shown in FIG. 6 press the tapes at both sides of the leads and at a portion between the leads, thereby to ensure a complete adhesion to the adhesive tapes 12.

Figure 19:
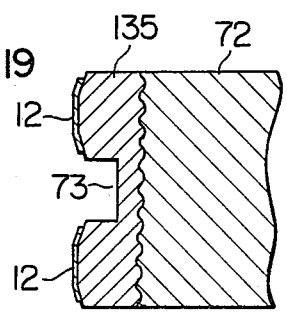
FIG. 19 is a fragmental sectional view of a drum incorporated in the apparatus.

As shown in FIG. 19, the surface of the drum 72 is coated with a silicon rubber layer 135 to which the adhesive tapes are less likely to be adhered. This silicon rubber layer plays the double role of an anvil or a cushioning material during the pressing of the tapes, as well as an anti-slipping layer for preventing the slipping of the tape.

At the same time, in order to prevent the adhesive tapes from being disengaged from the drum 72, the drum 72 has a convex outer peripheral surface which is protruded radially outwardly.

Figure 17:
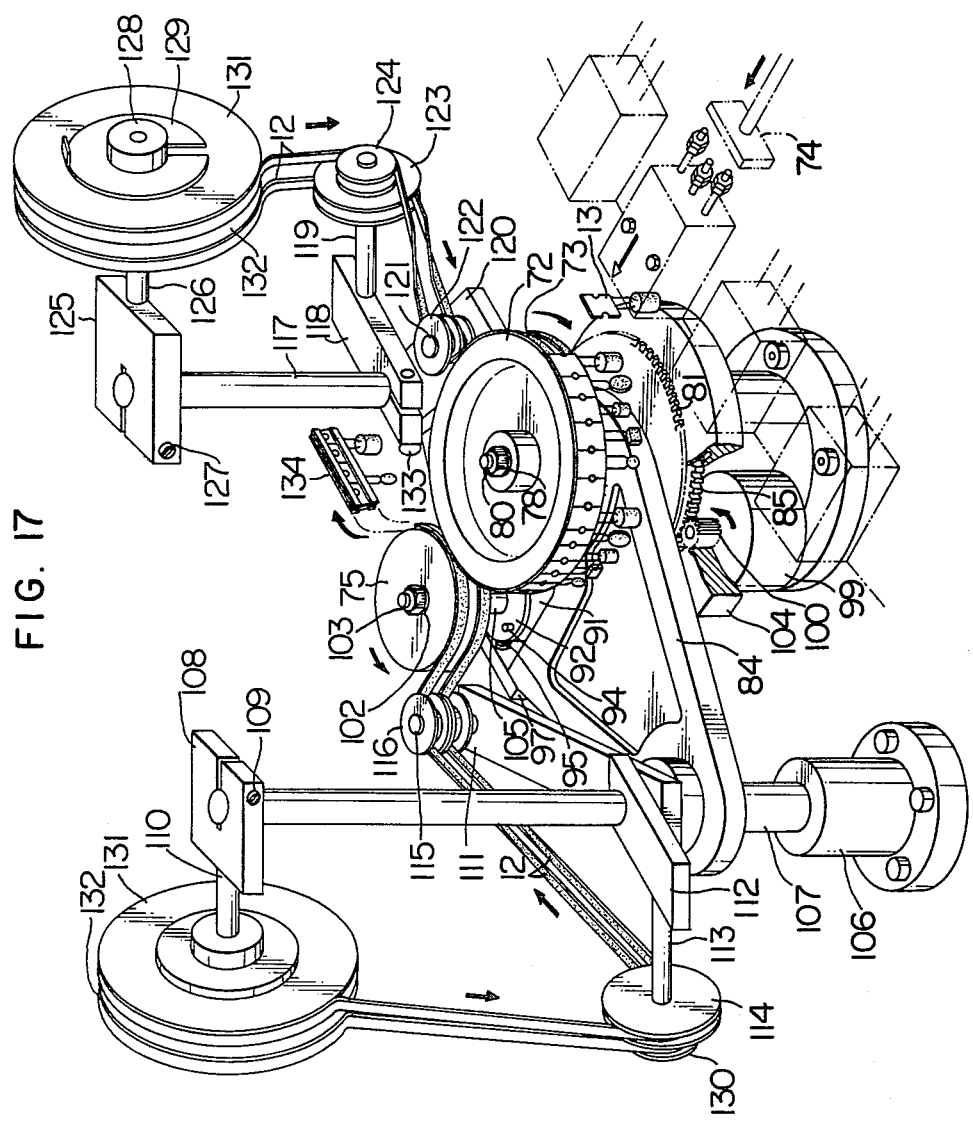
FIG. 17 is a perspective view of the taping mechanism of the apparatus.
Figure 18:
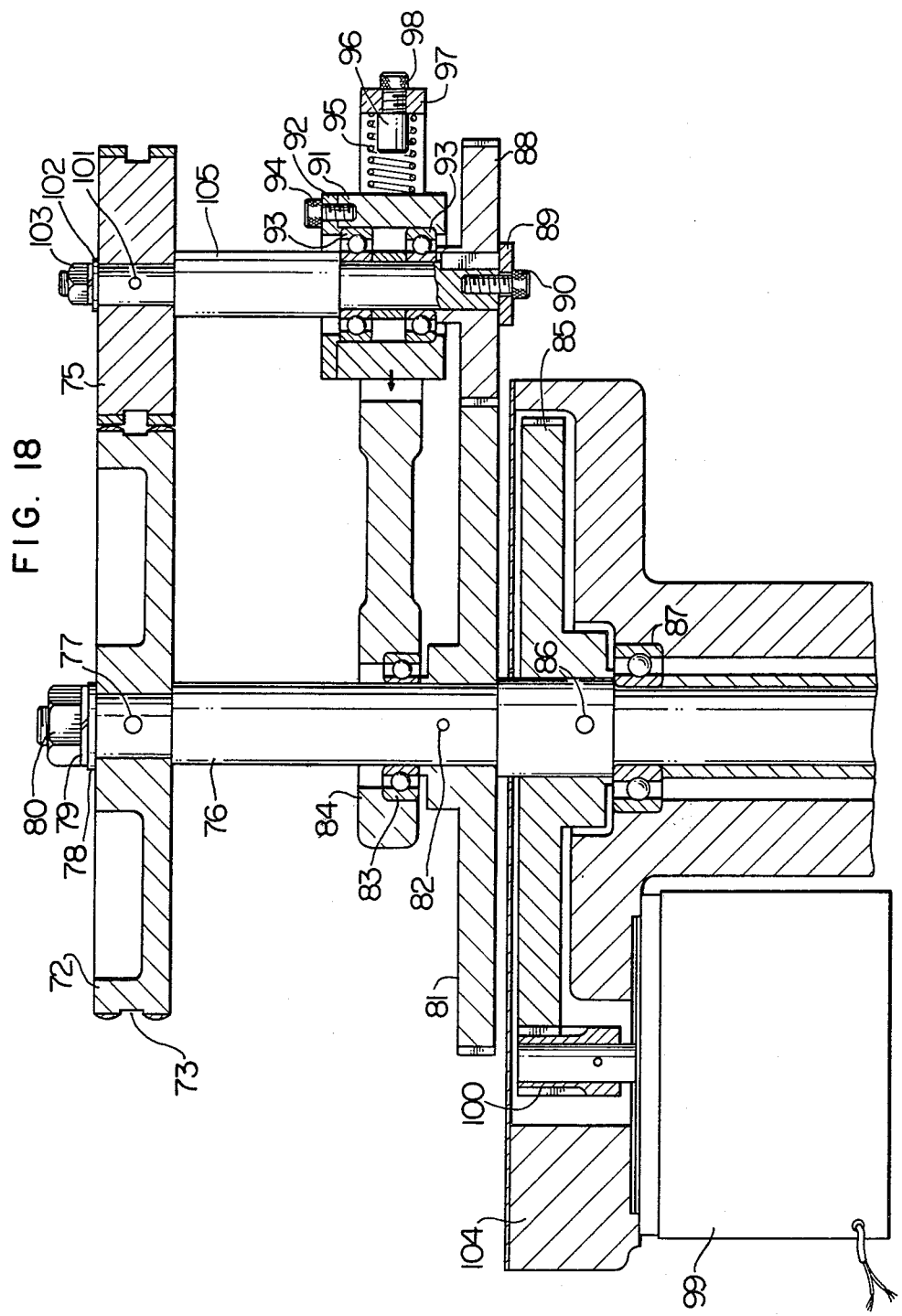
FIG. 18 is a sectional side elevational view of the taping mechanism of the apparatus.

FIG. 17 is a perspective view of the apparatus for rearranging and attaching the electric parts to form secondary taped parts. The front elevation of the essential part of this apparatus is shown at FIG. 18.

The taping drum 72 is fixed to the end of a shaft 76 by means of a pin 77, a flat washer 78, a spring washer 79 and a nut 80.

The shaft 76 is received by a bore formed in a roller arm 84 and is held rotatably by the latter by means of a bearing 83 fitted to the bore. The shaft 76 is fixed at its portion beneath the bearing 83 by means of a pin 82 to a first gear 81 for driving a pressing roller 75 which will be explained hereafter. Further, a follower gear 85 for driving the taping drum 72 is fixed to the shaft 76 by means of a knock pin 86. The shaft 76 is supported by a bearing 87 for free rotation with respect to the housing 104. The housing 104 is fixed to the machine body by means of bolts. A stepping motor 99 is mounted to the housing 104 in the illustrated manner. A drive gear 100 is fixed to the end of the shaft of the stepping motor 99 by means of a knock pin.

The stepping motor shaft makes a stepped angular displacement corresponding to the number of pulses delivered by the control circuit. As a result, the follower gear 85 for driving the drum makes an angular displacement which is reduced by the gear ratio between the drive gear 100 and the follower gear 85.

The taping drum 72 is arranged to make a simultaneous rotation with the rotation of the follower gear 85 because it is unitarily fixed to the latter. The amount of feed of the tape is the circumferential distance corresponding to the angular displacement of the taping drum. Thus, the amount of feed of the tape is adjustable by means of the number of pulses delivered to the stepping motor.

The electric part is pressed against the adhesive tapes 12 around the taping drum 72 by means of the stopper 17 of the carrier mechanism 4, as stated before. As will be seen from FIG. 17, this electric part is then brought into contact with the pressing roller 75 as the taping drum 72 is rotated. In order to ensure a perfect taping of the electric parts, two parallel adhesive tapes 12 are pressed against the adhesive tapes 12 on the drum 72, by means of the pressing roller 75. As a result, "secondary taped parts" in which various electric parts are rearranged in the desired order as shown in FIG. 5 are available at the outlet section 134.

The pressing roller 75 is carried by a shaft 105 which is rotatably supported by a bearing block 91. This bearing block 91 is received by an elongated bore formed in the roller arm 84 for free sliding movement in the direction of arrow. The bearing block 91 is pressed at its one end by a coiled spring 95 so as to press the pressing roller 75 against the taping drum 72. A pin 96 functions as a spring guide shaft, while a spring retainer block 97 is screwed to the roller arm 84. A reference numeral 92 denotes a lid, while reference numerals 94, 98 denote fixing screws. Bearings are designated at reference numeral 93. Reference numerals 101, 102 and 103 denote, respectively a pin, a washer and a nut.

The pressing roller 75 is adapted to be driven in synchronization with the rotation of the taping drum 72 and at the same peripheral speed with the latter by means of a first gear 81 through a second gear 88, the gear 88 being fixed to the shaft 105 by means of the washer 89 and the screw 90.

The adhesive tapes 12 for the secondary taped parts are extracted from a pair of adhesive tape reels 131, 132, respectively. The adhesive tape reels 131, 132 are arranged in parallel. Reference numerals 128 and 129 denote, respectively, a reel retaining member and a reel retaining plate.

Reference numerals 107, 117 denote adhesive tape stand shafts for supporting the adhesive tape reels 131, 132. The shaft 107 is received by a stand 106. Reel shafts 110, 126 are carried by respective shafts 107, 117 by means of fastening blocks 108 and 125, respectively. Reference numerals 109, 127 denote fastening screws. Guide rollers 123, 124, 114, 130 are positioned so as to guide the adhesive tapes where the direction of runing of these tapes is changed. Their shafts 119, 113 are carried by the adhesive tape stand shafts by means of fixing blocks 118, 112.

Tension rollers 115, 116 and 121, 122 are secured to respective adhesive tape stand shafts 107, 117 by means of tension arms 111, 120.

The secondary taped parts consisting of various electric parts rearranged in the predetermined order are taken up by a reel under a certain tension or folded down to be stored in a fox.

The operation of the taping mechanism will be now described with reference to FIGS. 17 and 18.

A pair of adhesive wheels 12 drawn out from the adhesive tape reels 131, 132 through the rollers 123, 124, 120 and 122, are set around the outer periphery of the taping drum with their adhesive faces facing outwardly. These tapes 12 are extended with their leading end portions over the portion where the pressing roller 85 abuts. Another pair of adhesive tapes 12 drawn from the other adhesive tape reels 13, 132 through rollers 114, 130, and 116 are set around the outer periphery of the pressing rollers 75 so that the leading end portions of another pair of the adhesive tapes 12 are aligned with that of the associated pair of adhesive tapes on the taping drum 75 with their adhesive surfaces mating with one another.

During the actuation of the taping mechanism, electric parts carried by the carriers 4 are successively pressed onto the pair of adhesive tapes 12 on the taping drum 75 by means of a pusher 74 with tape pieces 13 being attached on the adhesive surfaces of the adhesive tapes 12. Every time when one electric part is pressed and attached to the adhesive tapes 12, the taping drum 75 is partially rotated by one pitch corresponding to the width of the tape pieces 13. This rotation is effected by means of stepping motor 99 through drive gear 100 and follower gear 85. The rotation of the taping drum 75 is controlled by the number of pulses delivered from a control circuit (not shown) connected to motor 99. The rotating distance of the taping drum 75 is easily adjusted by changing the number of pulse signals transmitted from the control circuit.

The taping drum 75 is intermittently rotated each time an electric part has been pressed to the adhesive tapes 12 on the taping drum 75. In the repetition of the intermittent rotation, the electric parts are held on the adhesive tapes 12 in a predetermined order with their tape pieces 13 lying on the adhesive tapes 12 and leaving no gaps. The electric parts are successively sent in the direction of the arrow as shown in FIG. 17, and then are driven through the narrow space between the pressing roller 85 and the taping drum 75, so that another pair of the adhesive tapes are applied on the tape pieces 13 laid on the adhesive tapes 12 on the taping drum 75. Thus, the secondary tape parts 134 are obtained. As shown in FIG. 18, the pressing roller 85 is engaged to the taping drum 75 through the first gear 81 and the second gear 88, so that the feeding of another pair of adhesive tapes 12 is made equal in distance to that of the adhesive tapes 12 on the taping drum 75. The secondary taped parts 134 obtained are taken up by the winding mechanism 6 as shown in FIG. 2.

Figure 22:
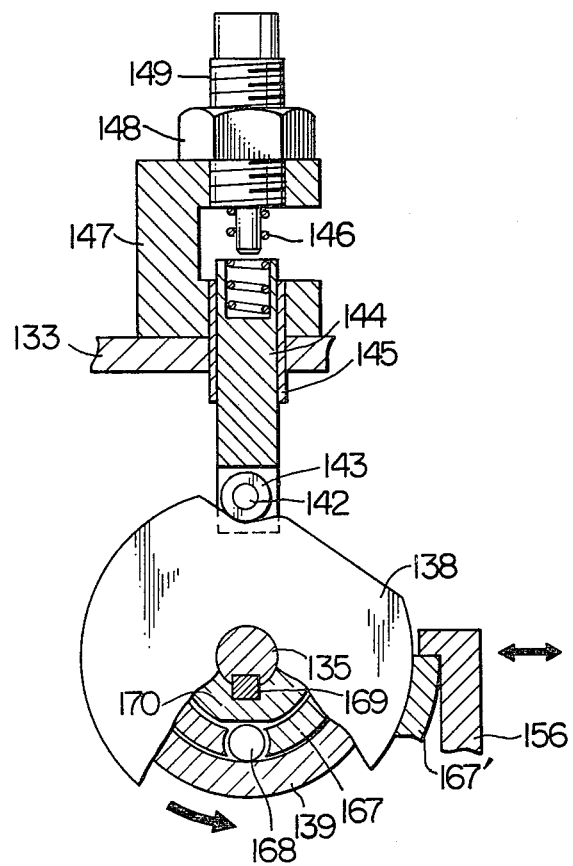
FIG. 22 is a sectional plan view of a detent action mechanism for a clutch in the cutter driving mechanism incorporated in the apparatus.

To explain the cutter driving mechanism in more detail with specific reference to FIGS. 20 through 22, the cutter actuating mechanism 2 is disposed beneath each of the cutter mechanism 1 disposed on the periphery of the turn table 3. Referring to FIG. 20, the power is transmitted to the shaft 151 of the cutter actuating mechanism 2, through a speed changing gear 166 from the motor 165 as shown in FIG. 2. One of the characteristic features of this cutter actuating mechanism resides in that the number of these cutter driven mechanisms can easily be increased or decreased by a simple connecting and disconnecting operation in accordance with the number of the cutter mechanism 1. More specifically, as shown in FIG. 20, the driving power is transmitted to an intermediate gear 152 fixed to the shaft 151 by a pin 164. Since the shaft 151 is rotatably carried by the housing 133 of the cutter actuating mechanism 2 through bearings 153, 150, and intermediate gear 152 fixed to the shaft 151 is also rotated. The power is then transmitted to a main shaft gear 140 meshing with the intermediate gear 152. When a plurality of the cutter actuating mechanisms are combined, the intermediate gear of the adjacent mechanism engages this main shaft gear 140 so that the power is successively transmitted to these cutter actuating mechanisms 2 thereby to drive the latter.

The main shaft gear 140 is usually fixed to the outer wheel of a clutch 139 and is separated from the main shaft 135. However, as the clutch operates, the main shaft gear 140 is connected to the main shaft 135 to rotate together with the latter. Thus, the main shaft gear 140 is usually allowed to freely rotate around the shaft 135. The main shaft 135 is secured to a driven wheel 170 of the clutch by means of a key 169 as shown in FIG. 22. Reference numerals 136, 134 denote bushes for receiving the main shaft 135, while reference numeral 137 denotes a retainer. Reference numeral 167 designates an operating ring. As this ring becomes operative, an intermediate roller is moved to the operative position to permit the transmission of the power from the main shaft gear 140 to the main shaft 135.

The clutch incorporated in the cutter actuating mechanism is of a known type having intermediate rollers, the principle of which is shown in FIG. 22.

A stopper claw 167' is disposed at the periphery of the clutch operation ring 167. This stopper claw is adapted to play the role of a stopper in cooperation with a lever 156 which is adapted to be brought into the operative position by means of a solenoid 158. As the lever 156 is moved out of the position shown in FIG. 22 by the operation of the solenoid 158, an engaging roller 168 is displaced as the outer wheel 139 constituting the input side of the clutch rotates, from the position free from the driven wheel 170 to the position of a restricted space thereby to unitarily connect the outer wheel 139 and the driven wheel 170 to each other. In this state, the power is transmitted to the main shaft 135 to drive the cutter mechanism. For stopping the cutter actuating mechanism, the lever 156 associated with the solenoid comes into contact with the claw 167' of the operating ring 167, so that the engaging roller 168 is moved back to the free position to disconnect the inner driven wheel from the outer wheel.

For facilitating the withdrawal of the engaging roller 168, a cam 138 is fixed to the driven wheel 170. At the moment at which the hook of the lever 156 associated with the solenoid collides with the claw 167' of the operation ring, the cam plate 138, i.e. the driven wheel 170, is rotated anticlockwise by the force of the spring 146 acting on the cam roller 143. The disengagement of power transmission is facilitated partly because of the stopping force exerted by the lever 156 and partly because of this rotation of the driven wheel. Reference numeral 142 denotes a cam roller shaft, while reference numeral 144 denotes a plunger. Reference numerals 147, 148 and 149 denote, respectively, a plunger housing block, a fixing nut and a spring-loaded adjusting screw, respectively.

The cutter mechanism 1 is adapted to engage guide holes 160, 161 and is easily fixed by means of screws 162, 163.

As has been described, according to the invention, various kinds of radial type electric parts having at least two leads extending in the same direction are arrayed in a plurality of primary taped parts, such that one group of primary taped parts carries a plurality of the parts of the same kind. Th electronic parts are severed one by one and are rearranged and carried by successive carriers in the desired order of insertion to the printed circuit board.

Thus, various kinds of electronic components are automatically rearranged to form secondary taped parts in which the electric parts are arrayed in the predetermined order of insertion. These secondary taped parts are then delivered to the automatic part insertion device so as to be inserted into the substrate of the printed circuit board to complete the latter.

In addition, if the primary taped parts have one or more vacant spaces from which the electric parts have been removed, the lack of the electric part or parts is detected and the cutter mechanism is actuated until the next electric element is detected. The vacant tape pieces severed in this period are held by the carrier mechanism and then disposed. Therefore, it is possible to form the secondary taped parts without any lack or absence of the electric part.

What is claimed is:

1. An apparatus for arranging various kinds of electric parts in a predetermined order, each electric part having leads extending in one direction therefrom, comprising:
   a plurality of cutter mechanisms for cutting primary taped parts associated therewith, wherein said primary taped parts include primary electric parts of one kind which are arranged at a constant pitch with their leads adhesively held between a pair of tapes, and wherein said cutter mechanisms each cut their associated primary taped parts at spaces between adjacent primary part to form tape pieces having a width corresponding to said constant pitch and which carry said electric parts by said leads;
   a plurality of carrier mechanisms for holding said electric parts by retaining said tape pieces thereon, and for carrying said tape pieces;
   means for transferring said tape pieces from said cutter mechanisms to said carrier mechanisms; and
   means for attaching said tape pieces from said carrier mechanisms to secondary adhesive tapes in said predetermined order at said constant pitch so as to obtain secondary taped parts arranged in said predetermined order.

2. An apparatus for arranging various kinds of electric parts as claimed in claim 1, further comprising means for detecting the presence or absence of electric parts in said primary taped parts; and means for causing each cutter mechanism to operate repeatedly to cut said primary tape, when the absence of said electric part or parts is detected, until the next electric part is detected, and for suspending the movement of said carrier mechanisms while said cutter mechanism is conducting the repetitional cutting of said primary tape.

3. An apparatus for arranging various kinds of electric parts as claimed in claim 2, wherein each one of said carrier mechanisms is capable of carrying both said tape pieces carrying no electric part and said tape pieces having an electric part in a superposed manner said tape pieces having one electric part being then attached to said secondary adhesive tapes by said attaching means, said carrier mechanism being then moved, slightly, so as to force out said tape pieces having no electric part from said carrier mechanism.

4. An apparatus for arranging various kinds of electric parts as claimed in claim 1, wherein perforations are formed in said primary tapes at both sides of each electric part so that said primary tapes are cut into said tape pieces by said cutter mechanism at the mid point of each perforation, said carrier mechanism further comprising guide pins for engaging semicircular halves of said perforations at both sides of said tape pieces and a needle for stabbing said tape pieces thereby causing said carrier mechanism to hold said tape pieces having said electric part.

5. An apparatus for arranging various kinds of electric parts in a predetermined order for insertion into the substrate of a printed circuit board, wherein each electric part has leads extending in one direction therefrom, comprising:

a plurality of cutter mechanisms for cutting a tape of primary electric parts, wherein said tape of primary parts includes primary electric parts of one kind which are arranged at a constant pitch with their leads adhesively held between a pair of adhesive tapes, and wherein said cutter mechanisms each cut said tape of primary parts at spaces between adjacent primary parts to form tape pieces having a width corresponding to said constant pitch which carry said electric parts by said leads;

a plurality of carrier mechanisms for holding said electric parts by retaining said tape pieces thereon, and for carrying said tape pieces;

means for transferring said tape pieces from said cutter mechanism to said carrier mechanism; and means for attaching said tape pieces from said carrier mechanisms to secondary adhesive tapes in said predetermined order at said constant pitch so as to obtain secondary taped parts arranged in said predetermined order.

\* \* \* \* \*